(12) United States Patent
Saito

(10) Patent No.: US 11,710,883 B2
(45) Date of Patent: Jul. 25, 2023

(54) COMPOSITE ELECTRONIC COMPONENT

(71) Applicant: TAIYO YUDEN CO., LTD., Tokyo (JP)

(72) Inventor: Toshiyuki Saito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/565,375

(22) Filed: Dec. 29, 2021

(65) Prior Publication Data

US 2022/0311405 A1 Sep. 29, 2022

(30) Foreign Application Priority Data

Mar. 25, 2021 (JP) .................................. 2021-052182

(51) Int. Cl.
| | |
|---|---|
| *H01P 1/203* | (2006.01) |
| *H03H 7/46* | (2006.01) |
| *H03H 7/01* | (2006.01) |
| *H03H 1/00* | (2006.01) |

(52) U.S. Cl.
CPC ...... *H01P 1/20345* (2013.01); *H01P 1/20327* (2013.01); *H03H 1/00* (2013.01); *H03H 7/0115* (2013.01); *H03H 7/0123* (2013.01); *H03H 7/46* (2013.01); *H03H 2001/0085* (2013.01)

(58) Field of Classification Search
CPC ......... H03H 7/0115; H03H 2001/0085; H03H 7/46; H03H 7/0123; H01P 1/20345; H01P 1/20327

USPC ................................................... 333/175, 185
See application file for complete search history.

(56) References Cited

U.S. PATENT DOCUMENTS

| | | | |
|---|---|---|---|
| 6,768,399 B2 * | 7/2004 | Uriu ..................... | H01P 1/20345 333/204 |
| 2006/0145782 A1* | 7/2006 | Liu ......................... | H03H 7/463 333/132 |
| 2009/0108958 A1* | 4/2009 | Hadano ................ | H03H 7/1725 333/175 |
| 2013/0229241 A1 | 9/2013 | Imamura ....................... | 333/185 |
| 2014/0145798 A1 | 5/2014 | Masuda ......................... | 333/185 |

FOREIGN PATENT DOCUMENTS

| | | |
|---|---|---|
| JP | 2019-79865 A | 5/2019 |
| WO | WO 2012/066946 A1 | 5/2012 |
| WO | WO 2012/077498 A1 | 6/2012 |

* cited by examiner

*Primary Examiner* — Rakesh B Patel
(74) *Attorney, Agent, or Firm* — Stein IP, LLC

(57) ABSTRACT

A composite electronic component includes a multilayered body in which a plurality of dielectric layers and a plurality of conductor layers are alternately stacked, a first resonant circuit including a first line and a first capacitor, the first line being formed of one or more first conductor layers of the conductor layers, the first capacitor including a first electrode formed of a plurality of second conductor layers of the conductor layers, and a second resonant circuit including a second line and a second capacitor, the second line being formed of one or more third conductor layers of the conductor layers, the second capacitor including a second electrode formed of the second conductor layers, the second conductor layers being located between the one or more first conductor layers and the one or more third conductor layers.

12 Claims, 10 Drawing Sheets

COMPOSITE ELECTRONIC COMPONENT

CROSS-REFERENCE TO RELATED APPLICATION

This application is based upon and claims the benefit of priority of the prior Japanese Patent Application No. 2021-052182, filed on Mar. 25, 2021, the entire contents of which are incorporated herein by reference.

FIELD

A certain aspect of the present embodiments relates to a composite electronic component.

BACKGROUND

Filters for attenuating undesired interfering waves or multiplexers each including filters are used in wireless communication terminals typified by smartphones or the like. There has been known a filter or a multiplexer that includes a plurality of resonant circuits each having a line corresponding to an inductor and a capacitor in a multilayered body in which dielectric layers are stacked as disclosed in, for example, Japanese Patent Application Publication No. 2019-79865 and International Publication Nos. 2012/066946 and 2012/077498 (Patent Documents 1, 2, and 3, respectively). It is known to adjust the arrangement of a plurality of lines in the dielectric layer to control the magnetic field coupling between the lines of the resonant circuits as disclosed in, for example, Patent Document 2. It is known to provide a plurality of lines in different dielectric layers as disclosed in, for example, Patent Document 3.

SUMMARY

As the composite electronic component is miniaturized, the magnetic field coupling between lines increases. For example, in the case that the shape of the line is a spiral shape because of the miniaturization of the composite electronic component, the magnetic field coupling between the lines further increases. This makes it difficult to design the resonant frequency of the resonant circuit to have a desired value.

According to an aspect of the present disclosure, there is provided a composite electronic component including: a multilayered body in which a plurality of dielectric layers and a plurality of conductor layers are alternately stacked; a first resonant circuit including a first line and a first capacitor, the first line being formed of one or more first conductor layers of the conductor layers, the first capacitor including a first electrode formed of a plurality of second conductor layers of the conductor layers; and a second resonant circuit including a second line and a second capacitor, the second line being formed of one or more third conductor layers of the conductor layers, the second capacitor including a second electrode formed of the second conductor layers, the second conductor layers being located between the one or more first conductor layers and the one or more third conductor layers.

DETAILED DESCRIPTION

Hereinafter, a description will be given of embodiments of the present invention with reference to the accompanying drawings.

First Embodiment

Figure 1:
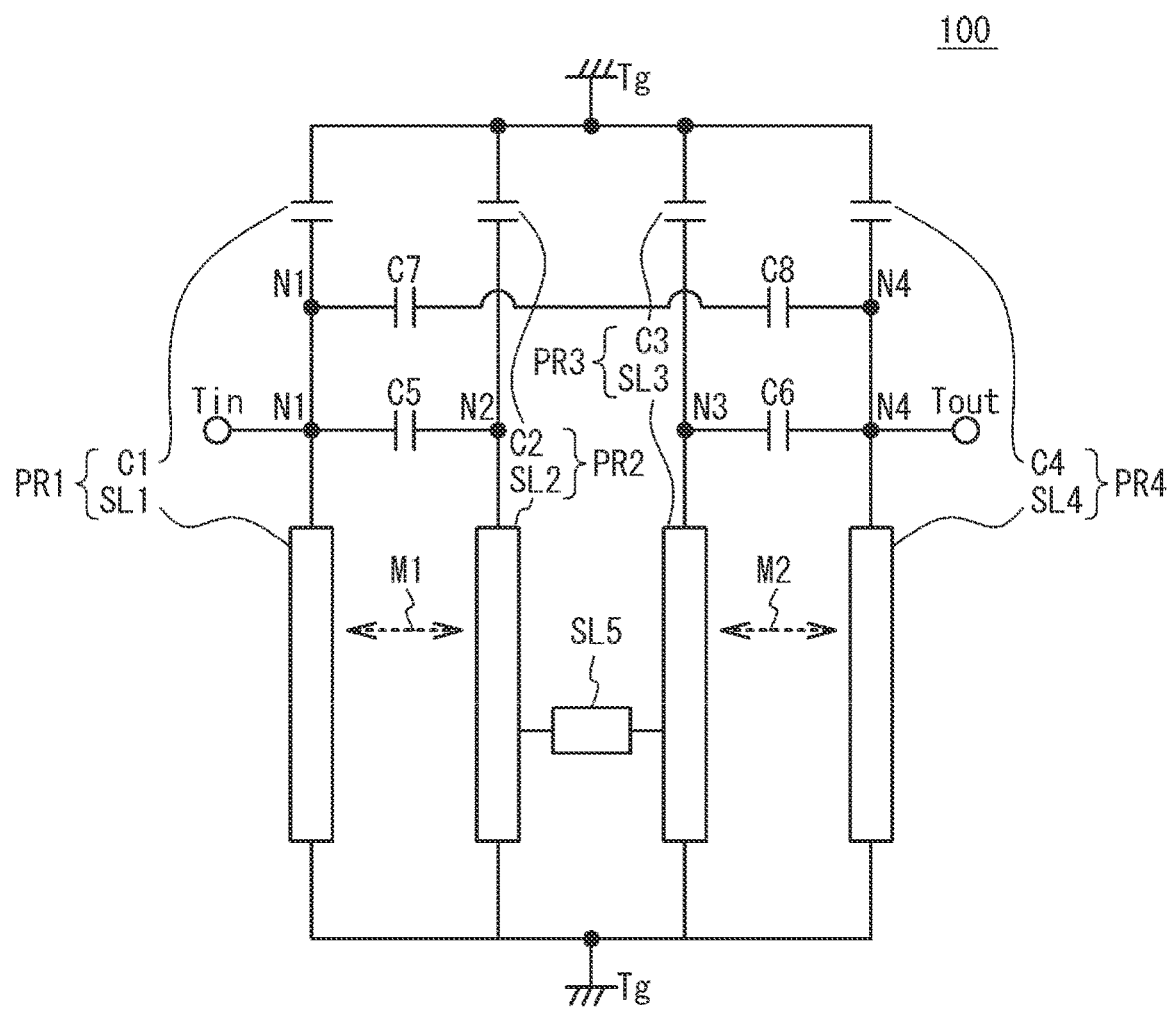
FIG. 1 is a circuit diagram of a filter in accordance with a first embodiment.

A bandpass filter (BPF) will be described as an example of a composite electronic component in accordance with a first embodiment. FIG. 1 is a circuit diagram of a filter in accordance with the first embodiment. As illustrated in FIG. 1, in a filter 100, parallel resonant circuits PR1 to PR4 are shunt connected between an Input terminal Tin and an output terminal Tout. The parallel resonant circuit PR1 includes a line SL1 and a capacitor C1 connected in parallel between a node N1 and a ground terminal Tg. The parallel resonant circuit PR2 includes a line SL2 and a capacitor C2 connected in parallel between a node N2 and the ground terminal Tg. The parallel resonant circuit PR3 includes a line SL3 and a capacitor C3 connected in parallel between a node N3 and the ground terminal Tg. The parallel resonant circuit PR4 includes a line SL4 and a capacitor C4 connected in parallel between a node N4 and the ground terminal Tg.

The nodes N1 and N2 are connected through a capacitor C5, and the nodes N3 and N4 are connected through a capacitor C6. The nodes N1 and N4 are connected not through the node N2 nor N3 but through capacitors C7 and C8. The lines SL2 and SL3 are connected through a line SL5. The lines SL1 to SL5 are, for example, transmission lines such as, but not limited to, striplines.

Figure 2:
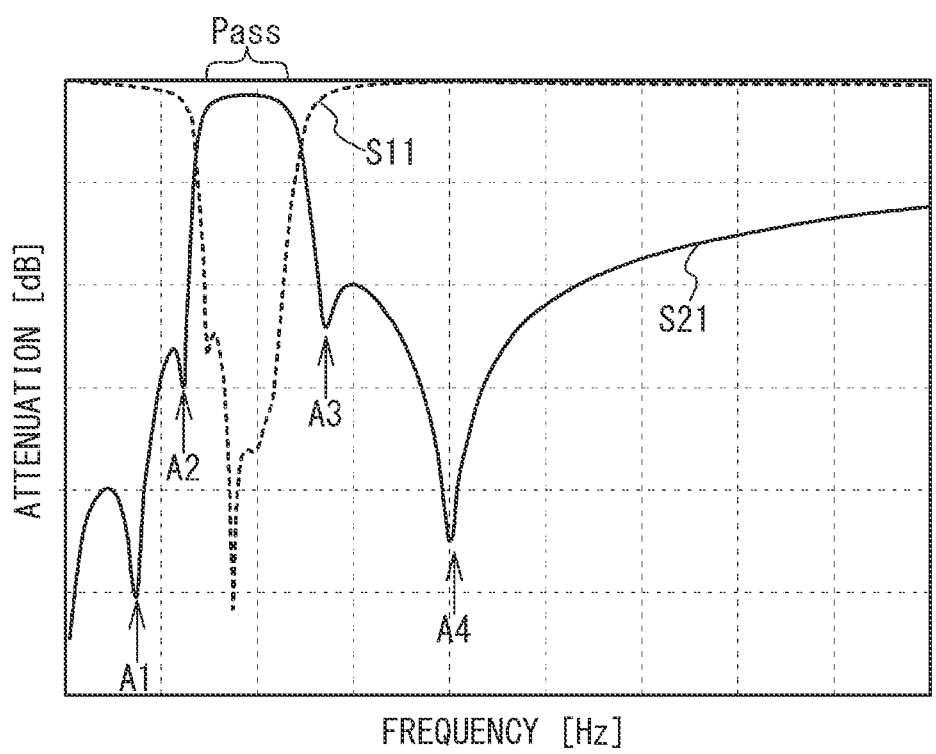
FIG. 2 presents transmission characteristics and reflection characteristics of the filter in the first embodiment.

FIG. 2 presents transmission characteristics and reflection characteristics of the filter in the first embodiment. As illustrated in FIG. 2, the transmission characteristics S21 of the filter 100 between the input terminal Tin and the output terminal Tout have a passband Pass and attenuation poles A1 to A4. The frequencies of the attenuation poles A1 and A2 are lower than that of the passband Pass, and the frequencies of the attenuation poles A3 and A4 are higher than that of the passband Pass. The attenuation poles A1 to A4 are formed mainly by the resonant frequencies of the parallel resonant circuits PR1 to PR4. The reflection characteristics S11 in the passband Pass is small, and the reflection characteristics S11 in the band other than the passband Pass is large. Therefore, among high-frequency signals input to the input terminal Tin, high-frequency signals in the passband Pass are transmitted from the input terminal Tin to the output terminal Tout through the capacitors C7 and C8 and the capacitors C5 and C6 and the line SL5. Signals with frequencies other than the passband Pass are suppressed.

To design the transmission characteristics of the filter 100 to have desired characteristics, the determining of the frequencies of the attenuation poles A1 to A4 is important. However, as illustrated in FIG. 1, the magnetic field coupling M1 between the lines SL1 and SL2 and the magnetic field coupling M2 between the lines SL3 and SL4 are generated. This makes it difficult to design the attenuation poles A1 to A4 to have desired frequencies. In the first embodiment, the setting of the frequencies of the attenuation poles A1 to A4 is eased by reducing the magnetic field couplings M1 and M2.

Figure 3A:
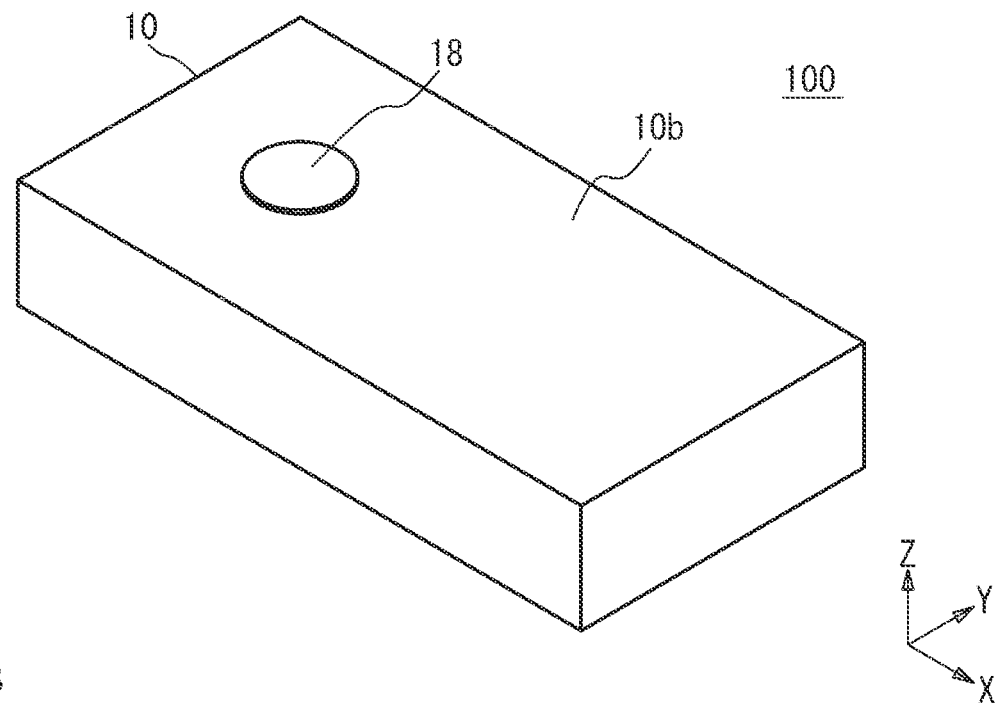
FIG. 3A and FIG. 3B are perspective views of the filter in accordance with the first embodiment.
Figure 3B:
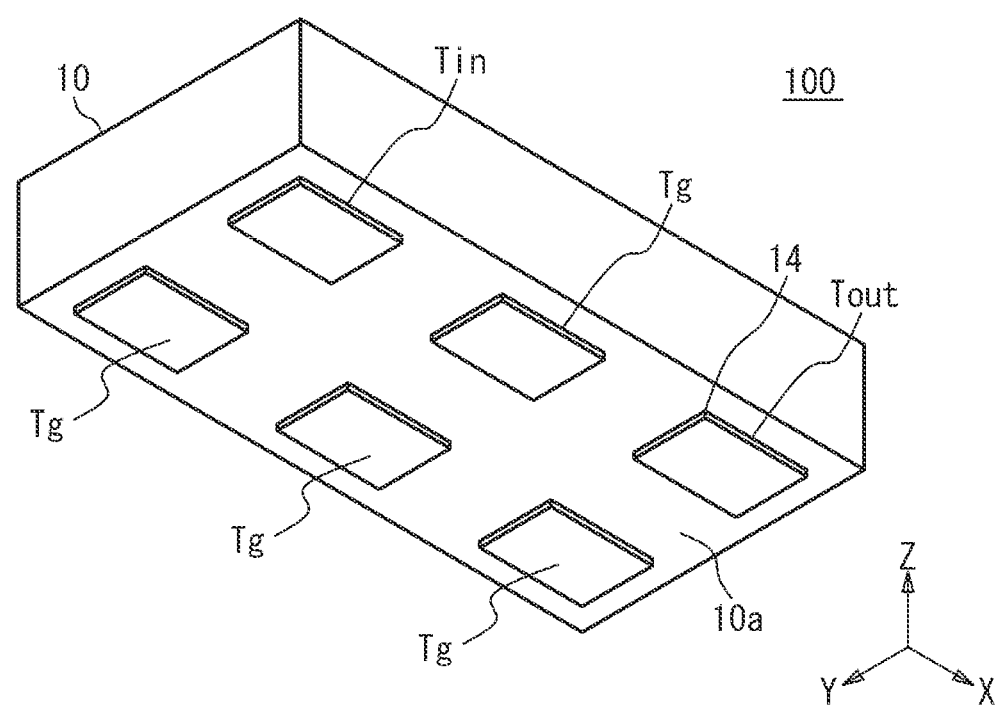

FIG. 3A and FIG. 3B are perspective views of the filter in accordance with the first embodiment. As illustrated in FIG. 3A and FIG. 3B, the filter 100 includes a multilayered body 10. The upper surface of the multilayered body 10 is a surface 10b having a direction identification mark 18 provided thereon. The lower surface of the multilayered body 10 is a surface 10a having terminals 14 formed thereon. The terminals 14 include the input terminal Tin, the output terminal Tout, and the ground terminals Tg. The multilayered body 10 has a substantially rectangular parallelepiped shape. The stack direction of the multilayered body 10 is defined as a Z direction, the long side direction of the rectangle in a plan view of the multilayered body 10 is defined as an X direction, and the short side direction of the rectangle in a plan view of the multilayered body 10 is defined as a Y direction.

Figure 4:
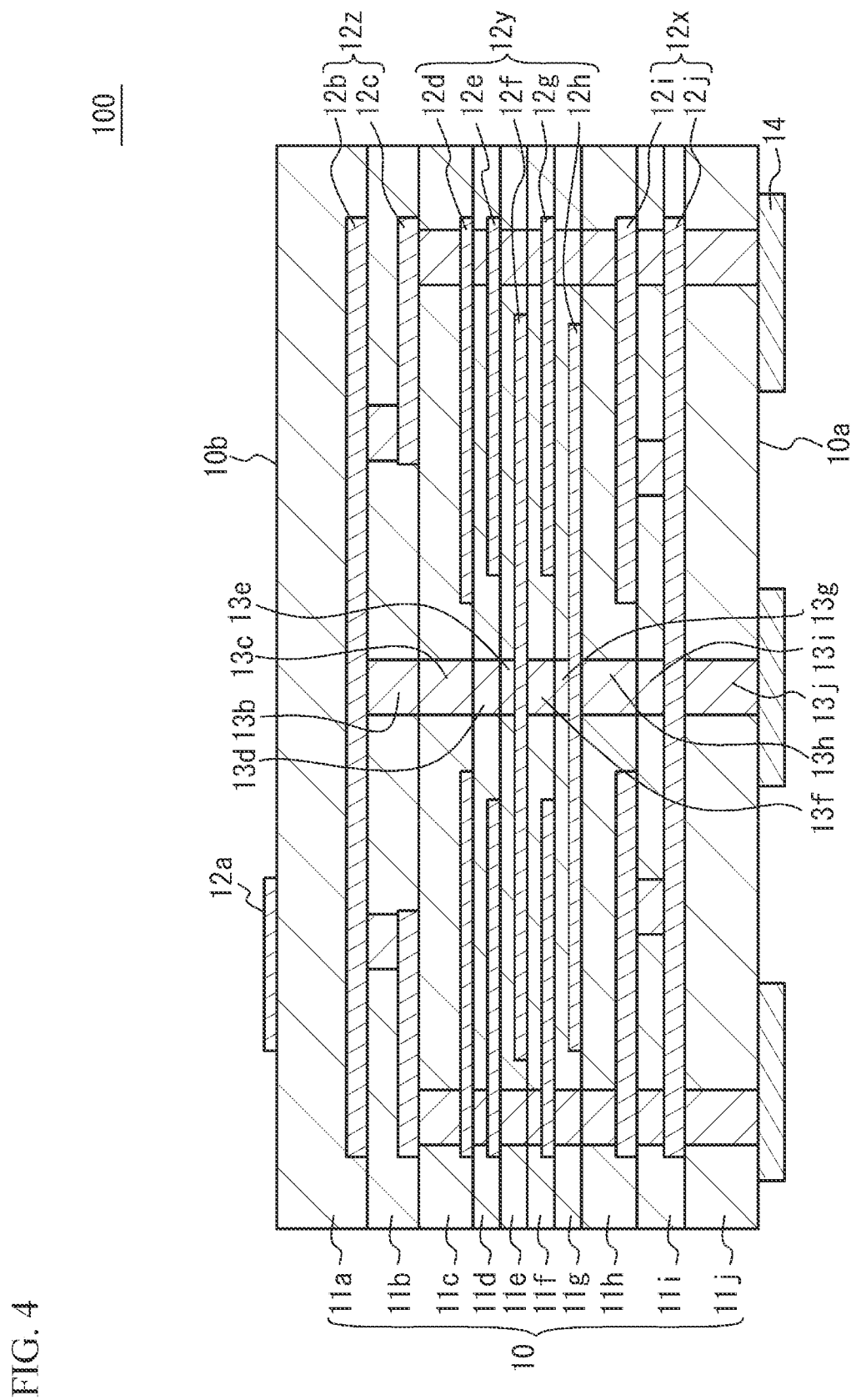
FIG. 4 is a cross-sectional view of the filter in accordance with the first embodiment.

FIG. 4 is a cross-sectional view of the filter in accordance with the first embodiment. As illustrated in FIG. 4, the multilayered body 10 includes dielectric layers 11a to 11j and conductor layers 12a to 12j that are alternately stacked in the Z direction. Via wirings 13b to 13j penetrating through the dielectric layers 11b to 11j are provided. Each of the via wirings 13b to 13j electrically connects at least two of the conductor layers 12b to 12j. The conductor layers 12i and 12j are first conductor layers 12x that form the lines SL1 and SL4. The conductor layers 12d to 12h are second conductor layers 12y that form the electrodes of the capacitors C1 to C8. The conductor layers 12b and 12c are third conductor layers 12z that form the lines SL2, SL3, and SL5.

Figure 5:
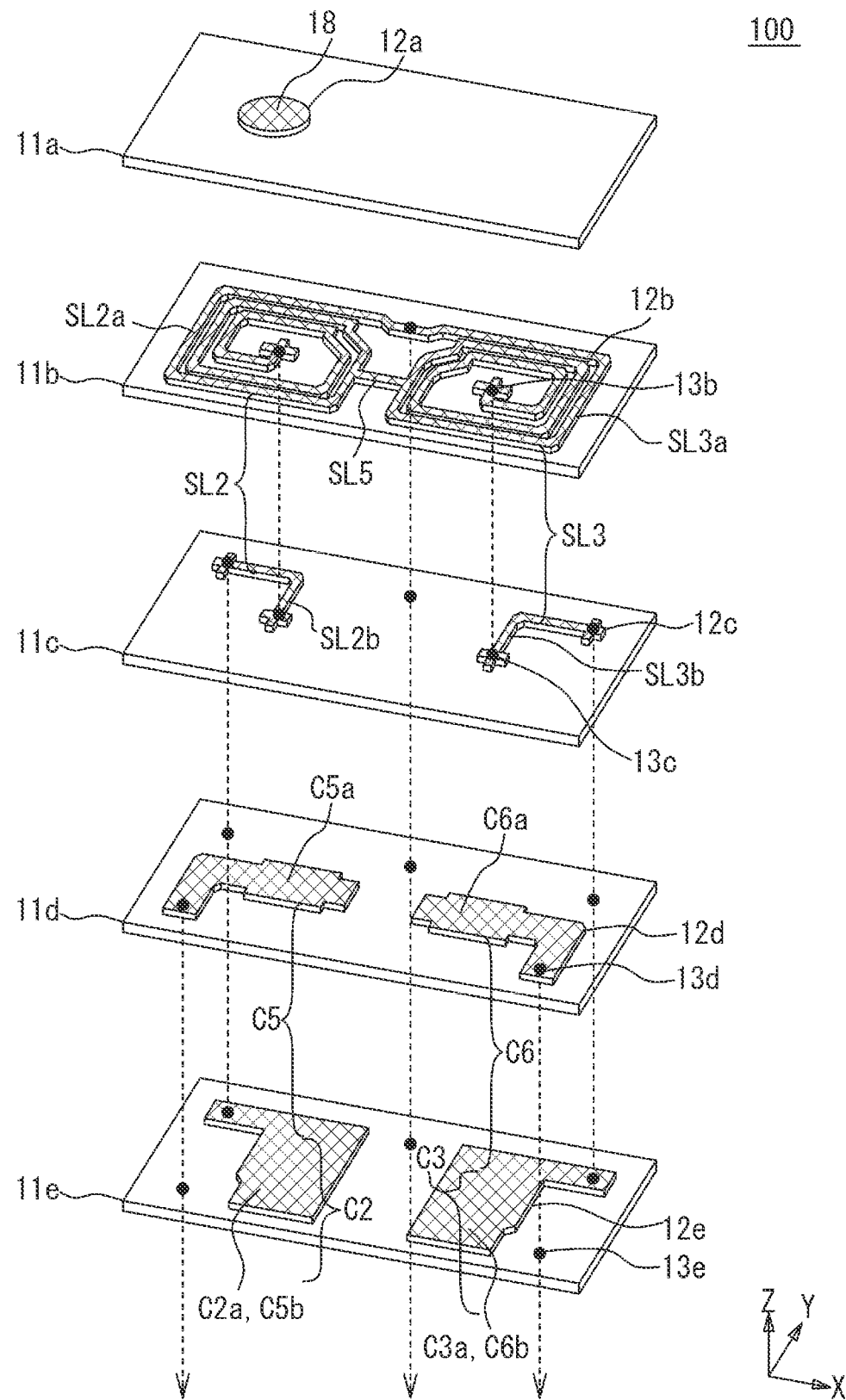
FIG. 5 is an exploded perspective view of the filter in accordance with the first embodiment.
Figure 6:
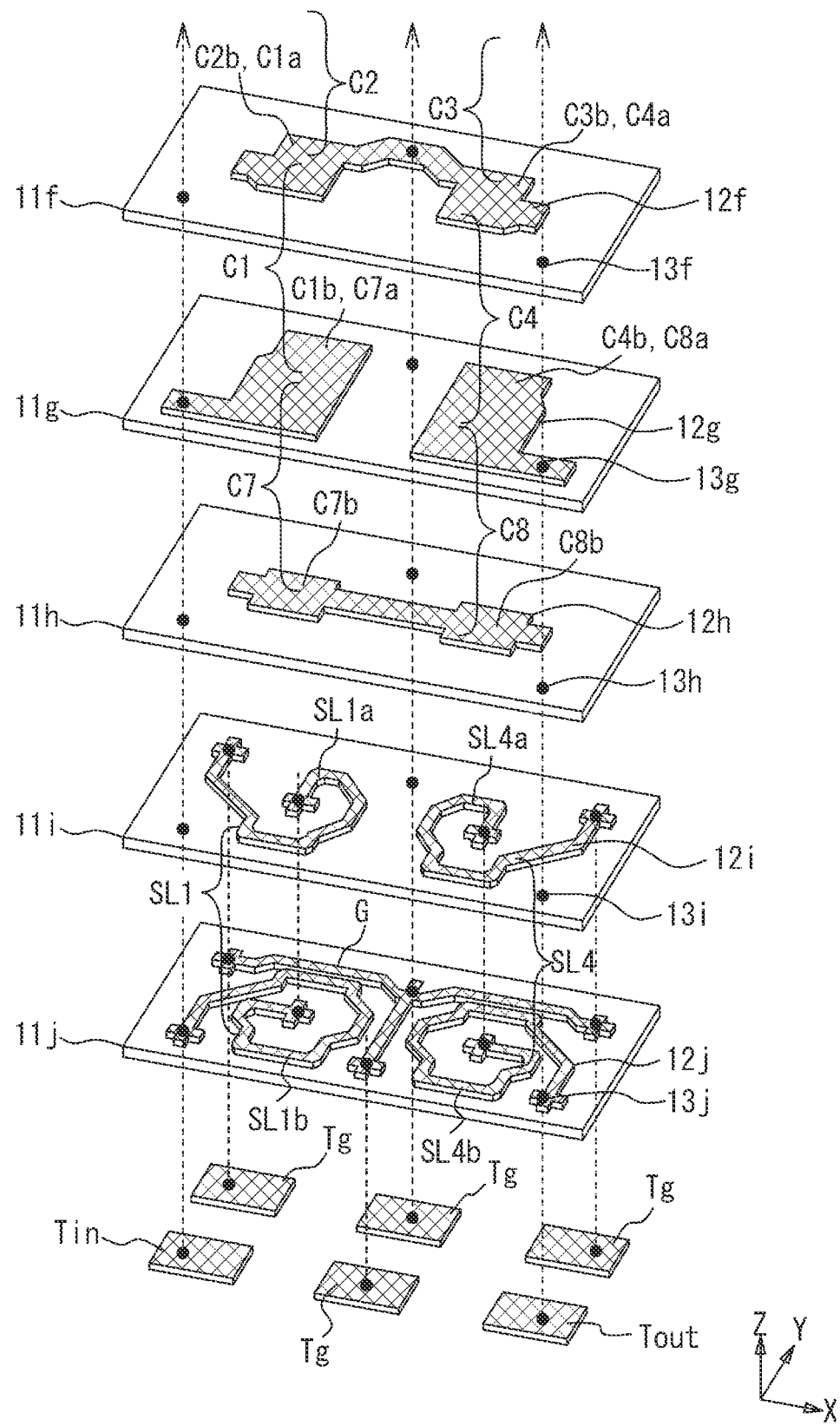
FIG. 6 is an exploded perspective view of the filter in accordance with the first embodiment.
Figure 7A:
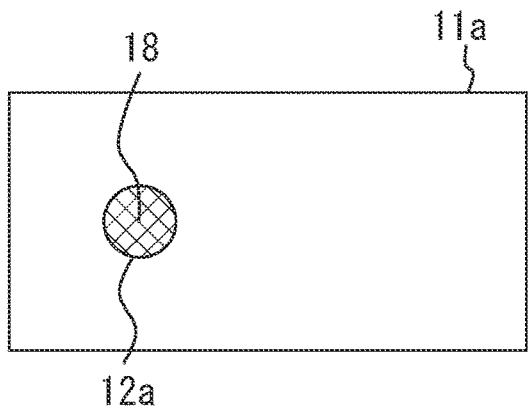
FIG. 7A to FIG. 7E are respective plan views of the dielectric layers and the conductor layers of the filter in accordance with the first embodiment.
Figure 7B:
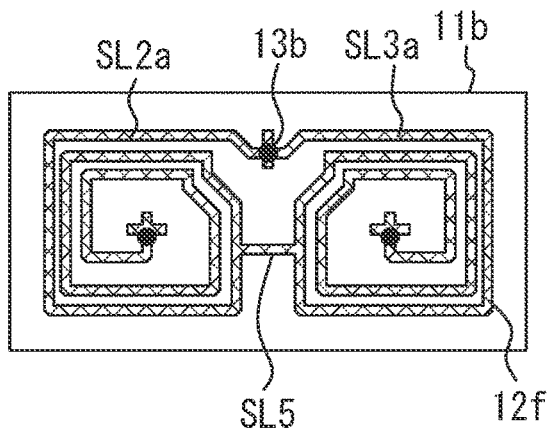
Figure 7C:
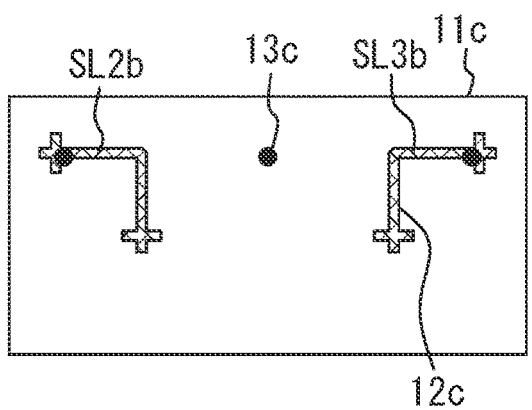
Figure 7D:
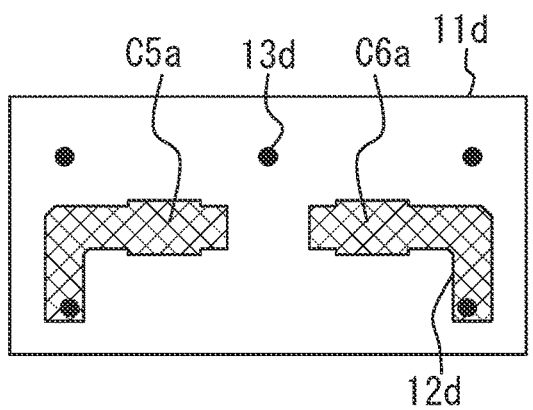
Figure 7E:
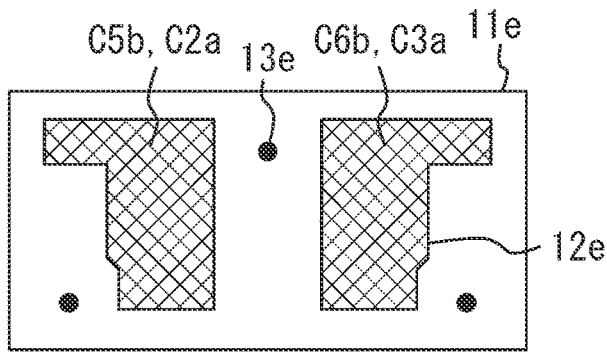
Figure 8A:
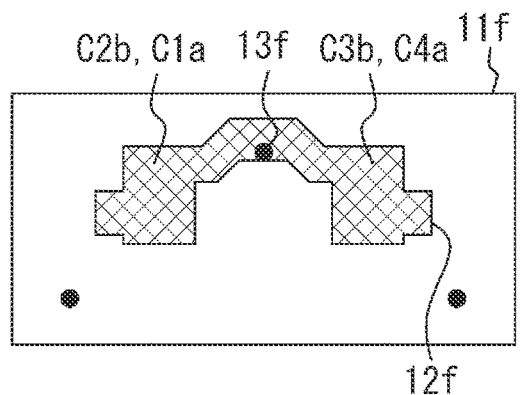
FIG. 8A to FIG. 8F are respective plan views of the dielectric layers and the conductor layers of the filter in accordance with the first embodiment.
Figure 8B:
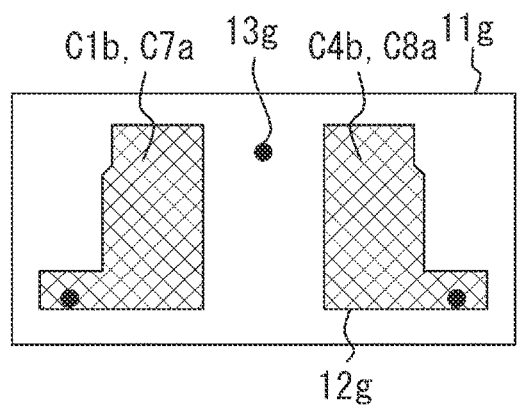
Figure 8C:
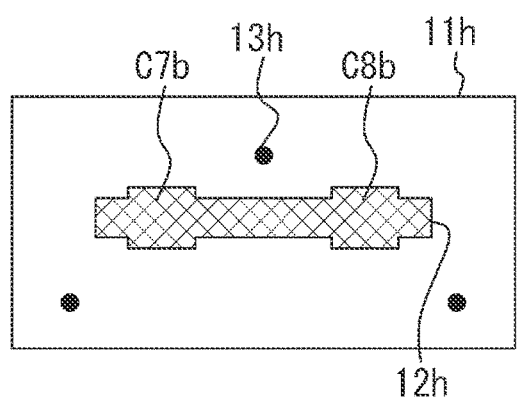
Figure 8D:
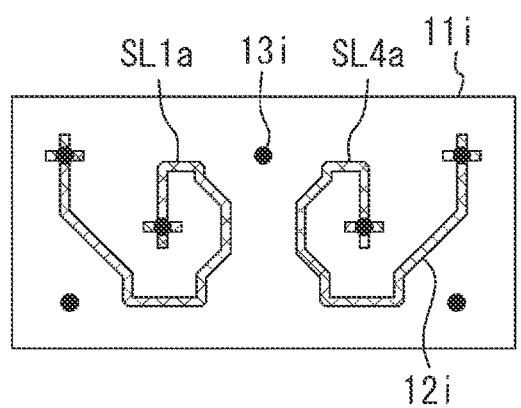
Figure 8E:
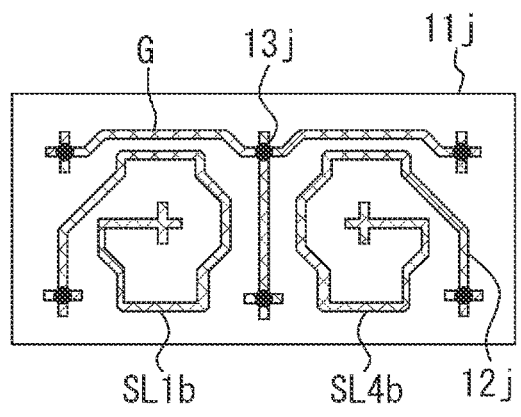
Figure 8F:
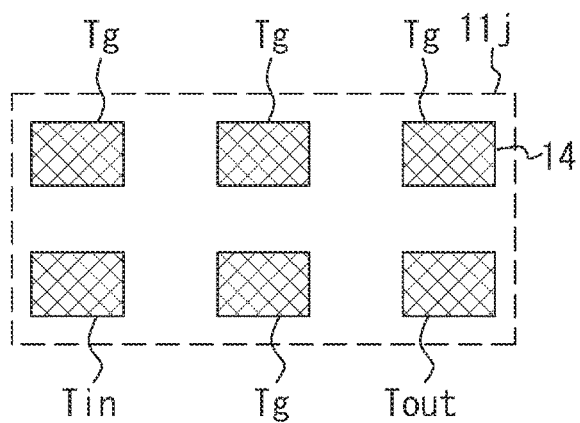

FIG. 5 and FIG. 6 are exploded perspective views of the filter in accordance with the first embodiment. In FIG. 5 and FIG. 6, the connections of the via wirings 13b to 13j are indicated by dashed lines. FIG. 7A to FIG. 7E and FIG. 8A to FIG. 8F are respective plan views illustrating the dielectric layers and the conductor layers of the filter in accordance with the first embodiment. FIG. 7A to FIG. 8E are plan views of the dielectric layers 11a to 11j, respectively. FIG. 8F is a plan view of the terminals 14 as viewed from above transparently through the dielectric layer 11j.

As illustrated in FIG. 5 to FIG. 8F, the conductor layer 12a formed on the dielectric layer 11a forms the direction identification mark 18. The conductor layer 12b located on the dielectric layer 11b forms lines SL2a and SL3a. The conductor layer 12c located on the dielectric layer 11c forms lines SL2b and SL3b. The lines SL2a and SL2b are electrically connected by the via wiring 13b to form the line SL2. The lines SL3a and SL3b are electrically connected by the via wiring 13b to form the line SL3. Each of the lines SL2a and SL3a has a spiral shape. The lines SL2a and SL2b form a three-dimensional spiral shape, and the lines SL3a and SL3b form a three-dimensional spiral shape. The conductor layer 12b includes the line SL5 connecting the lines SL2 and SL3.

The conductor layer 12d located on the dielectric layer 11d forms respective upper electrodes C5a and C6a of the capacitors C5 and C6. The conductor layer 12e located on the dielectric layer 11e forms respective lower electrodes C5b and C6b of the capacitors C5 and C6, and forms respective upper electrodes C2a and C3a of the capacitors C2 and C3. The dielectric layer 11d and the electrodes C5a and C5b sandwiching the dielectric layer 11d therebetween form the capacitor C5, while the dielectric layer 11d and the electrodes C6a and C6b sandwiching the dielectric layer 11d therebetween form the capacitor C6.

The conductor layer 12f located on the dielectric layer 11f forms respective lower electrodes C2b and C3b of the capacitors C2 and C3, and forms respective upper electrodes C1a and C4a of the capacitors C1 and C4. The dielectric layer 11e and the electrodes C2a and C2b sandwiching the dielectric layer 11e therebetween form the capacitor C2, while the dielectric layer 11e and the electrodes C3a and C3b sandwiching the dielectric layer 11e therebetween form the capacitor C3.

The conductor layer 12g located on the dielectric layer 11g forms respective lower electrodes C1b and C4b of the capacitors C1 and C4, and forms respective upper electrodes C7a and C8a of the capacitors C7 and C8. The dielectric layer 11f and the electrodes C1a and C1b sandwiching the dielectric layer 11f therebetween form the capacitor C1, and the dielectric layer 11f and the electrodes C4a and C4b sandwiching the dielectric layer 11f therebetween form the capacitor C4.

The conductor layer 12h located on the dielectric layer 11h forms respective lower electrodes C7b and C8b of the capacitors C7 and C8. The dielectric layer 11g and the electrodes C7a and C7b sandwiching the dielectric layer 11g therebetween form the capacitor C7, and the dielectric layer 11g and the electrodes C8a and C8b sandwiching the dielectric layer 11g therebetween form the capacitor C8.

The conductor layer 12i located on the dielectric layer 11i forms lines SL1a and SL4a. The conductor layer 12j located on the dielectric layer 11j forms lines SL1b and SL4b and a ground pattern G. The lines SL1a and SL1b are electrically connected by the via wiring 13i to form the line SL1. The lines SL4a and SL4b are electrically connected by the via wiring 13i to form the line SL4. Each of the lines SL1a, SL1b, SL4a, and SL4b has a spiral shape. The lines SL1a and SL1b form a three-dimensional spiral shape, and the lines SL4a and SL4b form a three-dimensional spiral shape.

The input terminal Tin, the output terminal Tout, and the ground terminals Tg are provided under the dielectric layer 11j by the terminals 14. The ground terminals Tg are electrically connected to the ground pattern G by the via wiring 13j.

The dielectric layers 11a to 11j are composed of a ceramic material, and contain, for example, oxides of Si, Ca, and Mg (for example, $CaMgSi_2O_6$, which is a diopside crystal) as the main components. The main components of the dielectric layers 11a to 11j may be oxides other than oxides of Si, Ca, and/or Mg. Further, the dielectric layers 11a to 11j may contain oxides of at least one of Ti, Zr, and Al as insulating materials.

The conductor layers 12a to 12j, the via wirings 13b to 13j, and the upper part of the terminal 14 are formed of non-magnetism metal layers mainly composed of, for example, Ag, Pd, Pt, Cu, Ni, Au, an Au—Pd alloy, or an Ag—Pt alloy. The upper part of the terminal 14 may contain a non-conductive material such as, but not limited to, $TiO_2$, ZrO$_2$, or Al$_2$O$_3$ in addition to the aforementioned metal material. The lower part of the terminal 14 is formed of a Ni film and a Sn film.

The multilayered body 10 is manufactured as follows, for example. The dielectric layers 11a to 11j are formed using, for example, the doctor blade method. The via wirings 13b to 13j penetrating through the dielectric layers 11b to 11j are formed. For example, via holes penetrating through the dielectric layers 11a to 11j are formed by laser irradiation. The via wirings 13b to 13j are formed in the via holes using the squeegee method or the like. The conductor layers 12a to 12j and the upper part of the terminal 14 are formed on the surfaces of the dielectric layers 11a to 11j. The conductor layers 12a to 12j and the upper part of the terminal 14 are formed using, for example, the screen printing method or the transfer method. The dielectric layers 11a to 11j are stacked to form the multilayered body 10. The dielectric layers 11a to 11j are stacked using, for example, thermal compression or an adhesive agent. The multilayered body 10 is fired at, for example, 700° C. or greater. This causes the dielectric layers 11a to 11j to be a sintered compact. The lower part of the terminal 14 is formed under the upper part of the terminal 14. The lower part of the terminal 14 is formed using, for example, the plating method such as, but not limited to, the barrel plating method.

Simulation

The transmission characteristics and the reflection characteristics of the filter of the first embodiment were simulated. The simulation conditions are as follows.

The width in the X direction of the multilayered body 10 is 1.0 mm, the width in the Y direction of the multilayered body 10 is 0.5 mm, and the height in the Z direction of the multilayered body 10 is 0.2 mm.

Table 1 lists the thickness of each of the dielectric layers 11a to 11j, the approximate value of the capacitance of each of the capacitors C1 to C8, and the approximate value of the inductance of each of the lines SL1 to SL5.

TABLE 1

| Dielectric layer | Thickness [μm] | Capacitor | Capacitance [pF] | Line | Inductance [nH] |
| --- | --- | --- | --- | --- | --- |
| 11a | 35 | C1 | 0.48 | SL1 | 1.8 |
| 11b | 15 | C2 | 0.37 | SL2 | 3.0 |
| 11c | 25 | C3 | 0.37 | SL3 | 3.0 |
| 11d | 10 | C4 | 0.48 | SL4 | 1.8 |
| 11e | 10 | C5 | 0.28 | SL5 | 0.1 |
| 11f | 10 | C6 | 0.28 | | |
| 11g | 10 | C7 | 0.40 | | |
| 11h | 15 | C8 | 0.40 | | |
| 11i | 15 | | | | |
| 11j | 35 | | | | |

FIG. 2 presents the simulation results of the transmission characteristics S21 and the reflection characteristics S11 of the filter in accordance with the first embodiment.

In Patent Documents 1 to 3, the capacitor constituting the resonant circuit is located closer to the terminal than the line constituting the resonant circuit. This is to reduce the interference between the metal pattern of the mounting board to which the terminal is bonded and the line. However, in the case that the distance between the lines SL1 and SL2 is short, the magnetic field coupling M1 is generated as illustrated in FIG. 1. In the case that the distance between the lines SL3 and SL4 is short, the magnetic field coupling M2 is generated. This causes the resonant frequencies of the parallel resonant circuits PR1 to PR4 to vary, making it difficult to design the attenuation poles A1 to A4 in FIG. 2 to be set at desired frequencies.

In the first embodiment, the parallel resonant circuit PR1 (a first resonant circuit) includes the line SL1 (a first line) and the capacitor C1 (a first capacitor), The line SL1 is formed of the conductor layers 12i and 12j (the first conductor layers 12x), and the electrodes C1a and C1b (a first electrode) of the capacitor C1 are formed of the conductor layers 12f and 12g (the second conductor layers 12y). The parallel resonant circuit PR2 (a second resonant circuit) includes the line SL2 (a second line) and the capacitor C2 (a second capacitor). The line SL2 is formed of the conductor layers 12b and 12c (the third conductor layers 12z), and the electrodes C2a and C2b (a second electrode) of the capacitor C2 are formed of the conductor layers 12e and 12f (the second conductor layers 12y). As illustrated in FIG. 4, the second conductor layer 12y is located between the first conductor layer 12x and the third conductor layer 12z. This structure increases the distance between the lines SL1 and SL2, and allows the electrodes of the capacitors C1 and C2 to be located between the lines SL1 and SL2. Therefore, the magnetic field coupling M1 between the lines SL1 and SL2 is reduced. Thus, the designing of the resonant frequencies of the parallel resonant circuits PR1 and PR2 becomes easier.

The parallel resonant circuit PR3 (a third resonant circuit) includes the line SL3 (a third line) and the capacitor C3 (a third capacitor). The line SL3 is formed of the conductor layers 12b and 12c (the third conductor layers 12z), and the electrodes C3a and C3b (a third electrode) of the capacitor C3 are formed of the conductor layers 12e and 12f (the second conductor layers 12y). The parallel resonant circuit PR4 (a fourth resonant circuit) includes the line SL4 (a fourth line) and the capacitor C4 (a fourth capacitor). The line SL4 is formed of the conductor layers 12i and 12j (the first conductor layers 12x), and the electrodes C4a and C4b (a fourth electrode) of the capacitor C4 are formed of the conductor layers 12f and 12g (the second conductor layers 12y). This structure increases the distance between the lines SL3 and SL4, and allows the electrodes of the capacitors C3 and C4 to be located between the lines SL3 and SL4. Therefore, the magnetic field coupling M2 between the lines SL3 and SL4 is reduced. Thus, the designing of the resonant frequencies of the parallel resonant circuits PR3 and PR4 becomes easier.

As illustrated in FIG. 1, the parallel resonant circuits PR1 to PR4 are parallel resonant circuits that are shunt connected between the input terminal Tin and the output terminal Tout. This allows the attenuation poles A1 to A4 illustrated in FIG. 2 to be formed by the resonant frequencies of the parallel resonant circuits PR1 to PR4. Since the magnetic field couplings M1 and M2 are reduced, the designing of the frequencies of the attenuation poles A1 to A4 becomes easier.

As illustrated in FIG. 1, the resonant circuit PR1 is electrically closest to the input terminal Tin among the resonant circuits PR1 to PR4, and the resonant circuit PR4 is electrically closest to the output terminal Tout among the resonant circuits PR1 to PR4. Therefore, the first conductor layers 12x are located between the surface 10a, on which the input terminal Tin and the output terminal Tout are provided, of the multilayered body 10 and the second conductor layers 12v. This structure reduces the connection distance between the input terminal Tin and the parallel resonant circuit PR1 and the connection distance between the output terminal Tout and the parallel resonant circuit PR4. The Q factors of the parallel resonant circuits PR2 and PR3 electrically far from the input terminal Tin and the output terminal Tout are preferably high. Since this structure makes the lines SL2 and SL3 far from the mounting board, the Q factors of the lines SL2 and SL3 are increased, and the Q factors of the parallel resonant circuits PR2 and PR3 can be increased.

In the case that at least a part of the line SL1 overlaps with at least a part of the line SL2 as viewed from the Z direction, the lines SL1 and SL2 are likely to be magnetic-field coupled. Thus, at least a part of the line SL1 is made to overlap with at least a part of at least one of the electrodes C1a, C1b, C2a, and C2b, and at least a part of the line SL2 is made to overlap with at least a part of at least one of the electrodes C1a, C1b, C2a, and C2b. This structure reduces the magnetic field coupling M1.

Similarly, in the case that at least a part of the line SL3 and at least a part of the line SL4 overlap as viewed from the Z direction, the lines SL3 and SL4 are likely to be magnetic-field coupled. Thus, at least a part of the line SL3 is made to overlap with at least a part of at least one of the electrodes C3a, C3b, C4a, and C4b, and at least a part of the line SL4 is made to overlap with at least a part of at least one of the electrodes C3a, C3b, C4a, and C4b. This structure reduces the magnetic field coupling M2.

As viewed from the Z direction, neither the line SL1 nor SL2 overlaps with the lines SL3 and SL4. Because of this structure, the magnetic field coupling between the line SL1 and each of the lines SL3 and SL4 is small, and the magnetic field coupling between the line SL2 and each of the lines SL3 and SL4 is small.

At least one of the lines SL1 to SL4 has a spiral shape. In the case that the line has a spiral shape, the magnetic field coupling among the lines SL1 to SL4 is large. Therefore, the second conductor layers 12y are preferably arranged between the first conductor layers 12x and the third conductor layers 12z. The spiral shape includes a helical shape and a spiral shape formed of a plurality of the conductor layers in addition to a spiral shape in the same conductor layer (the same plane). An example in which each of the lines SL1 to SL4 is formed of a plurality of conductor layers has been described, but each of the lines SL1 to SL4 may be formed of one conductor layer.

An example in which the filter has four parallel resonant circuits has been described, but the filter may have two, three, or five or more parallel resonant circuits.

Second Embodiment

Figure 9:
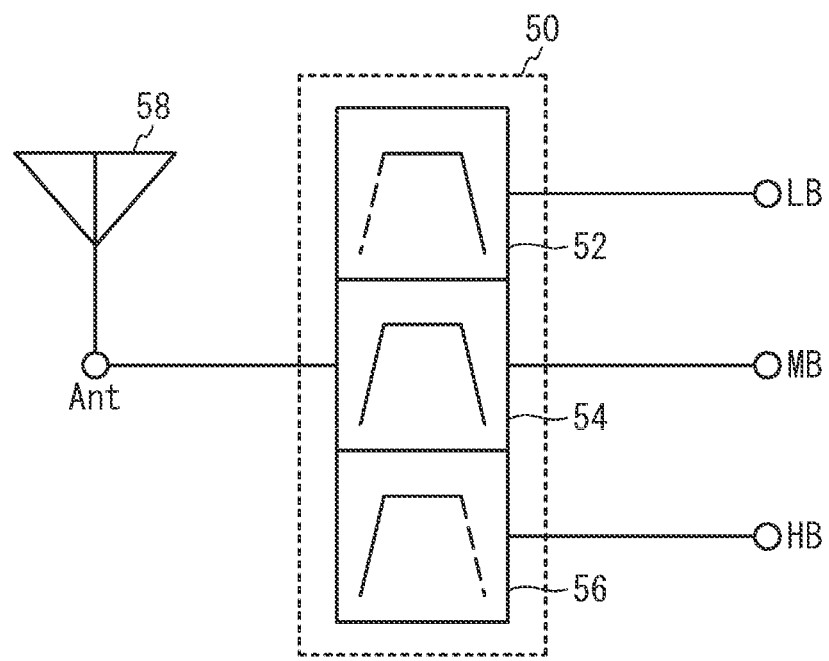
FIG. 9 is a circuit diagram of a triplexer in accordance with a second embodiment.

A second embodiment is an exemplary triplexer including the filter of the first embodiment. FIG. 9 is a circuit diagram of a triplexer in accordance with the second embodiment. As illustrated in FIG. 9, a triplexer 50 includes filters 52, 54, and 56. The filter 52 is connected between a common terminal Ant and a terminal LB, the filter 54 is connected between the common terminal Ant and a terminal MB, and the filter 56 is connected between the common terminal Ant and a terminal HB. An antenna 58 is coupled to the common terminal Ant. The filter 52 is, for example, a low-pass filter LPF or a bandpass filter BPF, allows high-frequency signals in the low band to pass therethrough, and suppresses signals with other frequencies. The filter 54 is, for example, a bandpass filter BPF, allows high-frequency signals in the middle band, which is higher than the low band in frequency, to pass therethrough, and suppresses signals with other frequencies. The filter 56 is, for example, a high-pass filter HPF or a bandpass filter BPF, allows high-frequency signals in the high band, which is higher than the middle band in frequency, to pass therethrough, and suppresses signals with other frequencies.

As least one of the filters 52, 54, and 56 can be the filter of the first embodiment. A multiplexer including at least two of the filters 52, 54, and 56 may be a composite electronic component. The triplexer has been described as an example of the multiplexer, but the multiplexer may be a diplexer, a duplexer, or a quadplexer.

First Variation of the Second Embodiment

Figure 10:
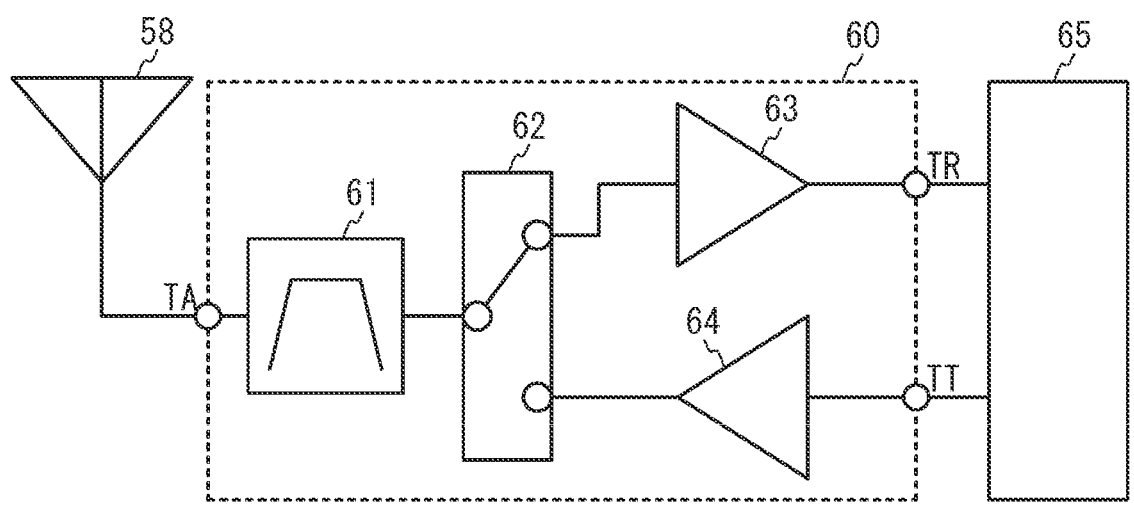
FIG. 10 is a circuit diagram of a communication module in accordance with a first variation of the second embodiment.

A first variation of the second embodiment is an exemplary communication module including the filter of the first embodiment. FIG. 10 is a circuit diagram of a communication module in accordance with the first variation of the second embodiment. As illustrated in FIG. 10, a module 60 includes a filter 61, a switch 62, a low noise amplifier (LNA) 63, and a power amplifier (PA) 64.

The antenna 58 is coupled to an antenna terminal TA. A first end of the filter 61 is coupled to the antenna terminal TA. The switch 62 is coupled to a second end of the filter 61. The input terminal of the LNA 63 and the output terminal of the PA 64 are coupled to the switch 62. The output terminal of the LNA 63 is coupled to a receive terminal TR. The input terminal of the PA 64 is coupled to a transmit terminal TT. A radio frequency integrated circuit (RFIC) 65 is coupled to the receive terminal TR and the transmit terminal TT.

The module 60 is, for example, a communication module of the time division duplex (TDD) communication system. In the TDD communication system, the transmit band and the receive band are in the same band. The filter 61 is, for example, a bandpass filter, allows high-frequency signals in the passband including the transmit band and the receive band to pass therethrough, and suppresses signals with other frequencies.

When a reception signal is received, the switch 62 connects the filter 61 to the LNA 63. This causes a high-frequency signal received by the antenna 58 to be filtered by the filter 61 to be a signal in the receive band, amplified by the LNA 63, and output to the RFIC 65. When a transmission signal is transmitted, the switch 62 connects the filter 61 to the PA 64. This causes a high-frequency signal output from the RFIC 65 to be amplified by the PA 64, filtered by the filter 61 to be a signal in the transmit band, and output from the antenna 58.

The filter 61 in the communication module of the first variation of the second embodiment can be the filter of the first embodiment. The module may be communication modules having other circuit forms.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. A composite electronic component comprising:
   a multilayered body in which a plurality of dielectric layers and a plurality of conductor layers are alternately stacked;
   a first resonant circuit including a first line and a first capacitor, the first line being formed of one or more first conductor layers of the plurality of conductor layers, the first capacitor including a first electrode formed of a plurality of second conductor layers of the plurality of conductor layers;

a second resonant circuit including a second line and a second capacitor, the second line being formed of one or more third conductor layers of the plurality of conductor layers, the second capacitor including a second electrode formed of the plurality of second conductor layers, the plurality of second conductor layers being located between the one or more first conductor layers and the one or more third conductor layers; and an input terminal and an output terminal, wherein the first resonant circuit and the second resonant circuit are parallel resonant circuits that are shunt connected between the input terminal and the output terminal, wherein the one or more first conductor layers are located between a surface, on which the input terminal and the output terminal are provided, of the multilayered body and the plurality of second conductor layers.

2. The composite electronic component according to claim 1, wherein one or both of the first line and the second line have a spiral shape.

3. The composite electronic component according to claim 1, further comprising:
- a third resonant circuit including a third line and a third capacitor, the third line being formed of the one or more third conductor layers, the third capacitor including a third electrode formed of the plurality of second conductor layers, the third resonant circuit being a parallel resonant circuit that is shunt connected between the input terminal and the output terminal; and
- a fourth resonant circuit including a fourth line and a fourth capacitor, the fourth line being formed of the one or more first conductor layers, the fourth capacitor including a fourth electrode formed of the plurality of second conductor layers, the fourth resonant circuit being a parallel resonant circuit that is shunt connected between the input terminal and the output terminal.

4. The composite electronic component according to claim 3, wherein the first resonant circuit is a resonant circuit that is electrically closest to the input terminal among the first resonant circuit, the second resonant circuit, the third resonant circuit, and the fourth resonant circuit, and the fourth resonant circuit is a resonant circuit that is electrically closest to the output terminal among the first resonant circuit, the second resonant circuit, the third resonant circuit, and the fourth resonant circuit.

5. The composite electronic component according to claim 1, wherein as viewed from a stack direction of the plurality of dielectric layers and the plurality of conductor layers, at least a part of the first line and at least a part of the second line overlap, at least a part of the first line and at least a part of at least one of the first and second electrodes overlap, and at least a part of the second line and at least a part of at least one of the first and second electrodes overlap.

6. The composite electronic component according to claim 1, further comprising a single filter including the first resonant circuit and the second resonant circuit.

7. The composite electronic component according to claim 6, wherein the input terminal is a single input terminal and the output terminal is a single output terminal.

8. The composite electronic component according to claim 1, further comprising a filter including the first resonant circuit and the second resonant circuit.

9. The composite electronic component according to claim 8, further comprising a multiplexer including the filter.

10. A composite electronic component:
- a multilayered body in which a plurality of dielectric layers and a plurality of conductor layers are alternately stacked;
- an input terminal and an output terminal;
- a first resonant circuit including a first line and a first capacitor, the first line being formed of one or more first conductor layers of the plurality of conductor layers, the first capacitor including a first electrode formed of a plurality of second conductor layers of the plurality of conductor layers, the first resonant circuit being a parallel resonant circuit that is shunt connected between the input terminal and the output terminal;
- a second resonant circuit including a second line and a second capacitor, the second line being formed of one or more third conductor layers of the plurality of conductor layers, the second capacitor including a second electrode formed of the plurality of second conductor layers, the plurality of second conductor layers being located between the one or more first conductor layers and the one or more third conductor layers, the second resonant circuit being a parallel resonant circuit that is shunt connected between the input terminal and the output terminal;
- a third resonant circuit including a third line and a third capacitor, the third line being formed of the one or more third conductor layers, the third capacitor including a third electrode formed of the plurality of second conductor layers, the third resonant circuit being a parallel resonant circuit that is shunt connected between the input terminal and the output terminal; and
- a fourth resonant circuit including a fourth line and a fourth capacitor, the fourth line being formed of the one or more first conductor layers, the fourth capacitor including a fourth electrode formed of the plurality of second conductor layers, the fourth resonant circuit being a parallel resonant circuit that is shunt connected between the input terminal and the output terminal, wherein the first resonant circuit is a resonant circuit that is electrically closest to the input terminal among the first resonant circuit, the second resonant circuit, the third resonant circuit, and the fourth resonant circuit, and the fourth resonant circuit is a resonant circuit that is electrically closest to the output terminal among the first resonant circuit, the second resonant circuit, the third resonant circuit, and the fourth resonant circuit, and wherein the one or more first conductor layers are located between a surface, on which the input terminal and the output terminal are provided, of the multilayered body and the plurality of second conductor layers.

11. The composite electronic component according to claim 10, further comprising a filter including the first resonant circuit and the second resonant circuit.

12. The composite electronic component according to claim 11, further comprising a multiplexer including the filter.

* * * * *